United States Patent
Marie Chevallier et al.

(10) Patent No.: US 7,368,317 B2
(45) Date of Patent: May 6, 2008

(54) METHOD OF PRODUCING AN N-TYPE DIAMOND WITH HIGH ELECTRICAL CONDUCTIVITY

(75) Inventors: Jacques Paul Marie Chevallier, Maurepas (FR); Zephirin Symplice Teukam, Saint-Denis (FR); Dominique Ballutaud, Ivry-sur-Seine (FR)

(73) Assignees: Centre National de la Recherche Scientifique-CNRS, Paris (FR); Universite de Versailles St-Quentin En Yvelines, Versailles (FR)

( * ) Notice: Subject to any disclaimer, the term of this patent is extended or adjusted under 35 U.S.C. 154(b) by 307 days.

(21) Appl. No.: 11/144,279

(22) Filed: Jun. 3, 2005

(65) Prior Publication Data

US 2005/0266606 A1 Dec. 1, 2005

Related U.S. Application Data

(63) Continuation of application No. PCT/FR03/03592, filed on Dec. 4, 2003.

(30) Foreign Application Priority Data

Dec. 6, 2002 (FR) .................................. 02 15453

(51) Int. Cl.
*H01L 21/00* (2006.01)
(52) U.S. Cl. ...................... 438/105; 438/485; 438/499; 438/914; 257/E21.042; 257/E21.107
(58) Field of Classification Search ............... 438/105, 438/485, 499, 914; 257/E21.042, E21.107
See application file for complete search history.

(56) References Cited

U.S. PATENT DOCUMENTS

| | | | |
|---|---|---|---|
| 5,653,800 A | * | 8/1997 | Kucherov et al. ............ 117/79 |
| 5,891,241 A | | 4/1999 | Yoshida |
| 6,340,393 B1 | | 1/2002 | Yoshida |

FOREIGN PATENT DOCUMENTS

| | | |
|---|---|---|
| EP | 0543392 A2 | 5/1993 |
| EP | 0646968 A1 | 4/1995 |
| EP | 1036863 A1 | 9/2000 |
| JP | 06151331 | 5/1994 |
| JP | 9-20593 | 1/1997 |
| JP | 10247624 | 9/1998 |

(Continued)

OTHER PUBLICATIONS

Preliminary Search Report for FA 630598/FR 0215453, Oct. 23, 2003.

(Continued)

*Primary Examiner*—Asok Kumar Sarkar
(74) *Attorney, Agent, or Firm*—Marshall, Gerstein & Borun LLP

(57) ABSTRACT

The invention relates to a method of producing an n-type diamond. The inventive method comprises an n-doping stage during which a donor species is vacuum diffused in a diamond that was initially doped with an acceptor, in order to form donor groups containing the donor species, at a temperature that is less than or equal to the dissociation temperature of the complexes formed between the acceptor and the donor species.

10 Claims, 1 Drawing Sheet

FOREIGN PATENT DOCUMENTS

| JP | 10287966 | 10/1998 |
|---|---|---|
| JP | 200026194 | 1/2000 |

OTHER PUBLICATIONS

International Search Report for PCT/FR 03/03592, Apr. 12, 2003.

Ballutad, D. et al., "Diffusion and thermal stability of hydrogen in homoepitaxial CVD diamond films", Diamond and Related Materials, 9(2000), p. 1171-74.

Chevallier, J. et al., "Hydrogen-boron interactions in p-type diamond", Physical Review B., vol. 58, No. 12, pp. 7966-7969.

Chevallier, J., et al., "Hydrogen in Monocrystalline CVD Boron Doped Diamond", Phys. Stat. Sol., 174, 73, 1999, pp. 73-81.

Chevallier, J., et al., "Hydrogen in n-type diamond", Diamond and Related Materials, 11(2002), pp. 1566-1571.

Chevallier, J., et al., "Hydrogen-acceptor interactions in diamond", Diamond and Related Materials, 10(2001), pp. 399-404.

Koizumi, S., et al., "Phosphorus-doped chemical vapor deposition of diamond", Diamond and Related Materials, 9(2000), pp. 935-940.

Landstrass and Ravi, "Resistivity of chemical vapor deposited diamond films" Applied Physics Letters, Sep. 1989, pp. 975-976.

Popovici, G., et al., "Diffusion of boron, lithium, oxygen, hydrogen, and nitrogen in type IIa natural diamond", Journal of Applied Physics, May 15, 1995, pp. 5103-5106.

Popovici, G., et. al., "Diffusion of Impurities Under Bias in CVD Diamond Films", Mat. Res. Soc. Symp. Proc., vol. 339, 1994, pp. 601-606.

Saguy, C., et al., "n-type diamond with high room temperature electrical conductivity by deuteration of boron doped diamond layers", Diamond and Related Materials, 13(2004), pp. 700-704.

Teukam, Z., et al., "Shallow donors with high n-type electrical conductivity in homoepitaxial deuterated boron-doped diamond layers", nature materials, vol. 2, Jul. 2003, pp. 482-486.

Teukam, Z., et. al., "Trap limited diffusion of hydrogen in boron-doped diamond", 12(2003), pp. 647-451.

Uzan-Saguy, C., et. al., "Hydrogen diffusion in B-ion-implanted and B-doped homo-epitaxial diamond: passivation of defects vs. passivation of B acceptors", Diamond and Related Materials, 10(2001), pp. 453-458.

\* cited by examiner

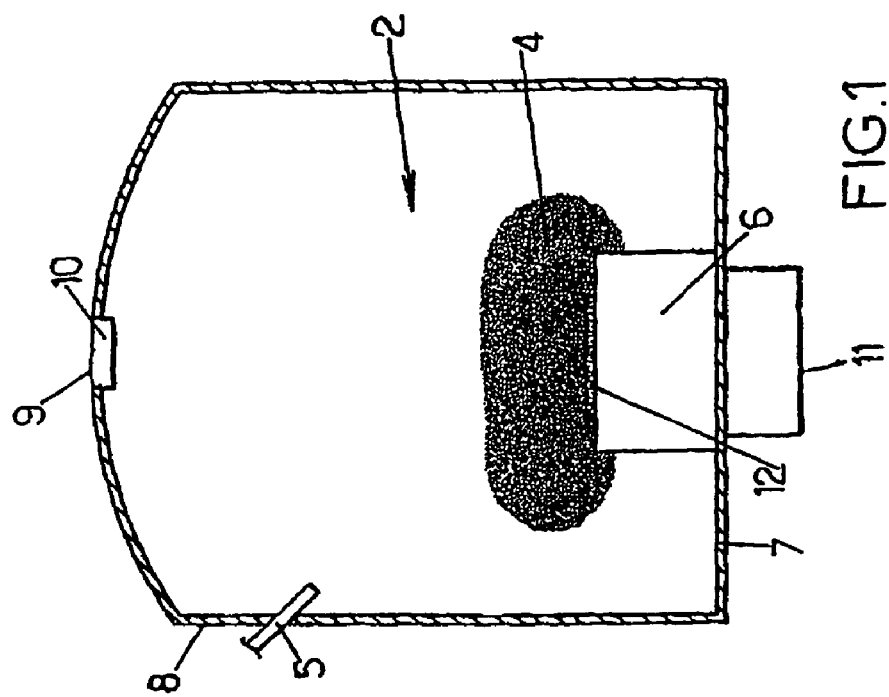
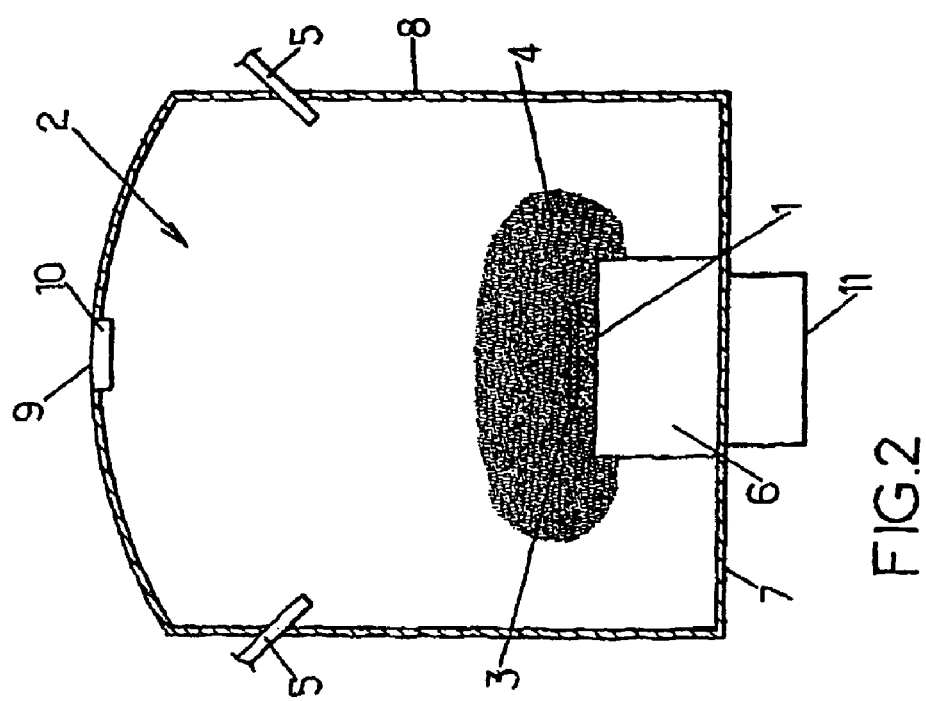

METHOD OF PRODUCING AN N-TYPE DIAMOND WITH HIGH ELECTRICAL CONDUCTIVITY

Cross-Reference to Related Applications

This application is a continuation of International Application No. PCT/FR2003/003592, filed Dec. 4, 2003, which claims the benefit of French Application No. 02/15453, filed Dec. 6, 2002.

The present invention relates to a process for producing n-type diamond.

The ever growing demand for electronic components has led to the search for alternatives to silicon as semiconductor material. Document JP-10-247624 describes an example of a process as mentioned above. In this process example, what is obtained is a diamond film n-doped by simultaneous deposition, on a diamond carbon substrate, of an electron acceptor, such as boron (B), and of an electron donor, such as nitrogen (N). The properties of such a diamond film make possible its use as a semiconductor at a temperature above about 400° C. However, the electrical conductivity of these films decreases with temperature, and at room temperature, which is the normal temperature of use of almost all semiconductors, the components thus obtained no longer have useful semiconducting properties. There is therefore a need for an n-type diamond having a high electrical conductivity at room temperature.

The object of the present invention is in particular to provide a process for producing such an n-type diamond.

For this purpose, and completely surprisingly, the inventors have shown that this objective can be achieved by a process for producing an n-type diamond, which includes an n-doping step in which a donor species is vacuum diffused into an initially acceptor-doped diamond, in order to form donor groups containing the donor species in said diamond, at a temperature that does not exceed the dissociation temperature of complexes formed between the acceptor and the donor species.

Thanks to these arrangements, an n-type diamond film is obtained that has a high electrical conductivity of the order of 1 $\Omega^{-1} \cdot cm^{-1}$ at room temperature. This film can therefore be used in any component and electronic apparatus operating at a temperature below the dissociation temperature of the complexes between the acceptor and the donor species, especially at room temperature.

In preferred methods of implementing the invention, one or other of the following arrangements may optionally be furthermore employed:

- the n-doping step comprises making the donor species diffuse for a long enough time for the concentration of donor species in the n-type diamond obtained to be at least equal to the acceptor concentration;
- the n-doping step is carried out in a chamber by forming, around the diamond, a plasma that contains the donor species, which is introduced in gaseous form into the chamber;
- the process furthermore includes, prior to the n-doping step, a p-doping step in which carbon atoms and acceptor atoms are simultaneously deposited, in a vacuum, on a diamond substrate, said atoms being contained in a plasma formed around the diamond substrate in order to form the acceptor-doped diamond;
- the p-doping step is carried out on a diamond buffer film placed on the diamond substrate;
- the p-doping step is carried out in a chamber by forming, around the diamond substrate, a plasma that includes the acceptor and the carbon, these being introduced in gaseous form into the chamber;
- the donor species is hydrogen;
- the acceptor is boron; and
- the acceptor is boron and the diffusion of the hydrogen donor species is carried out at a temperature of between 500° C. and 600° C., and preferably at around 550° C.

According to another aspect, the invention relates to an n-type diamond, characterized in that it possesses a conductivity at 300 K substantially equal to or greater than 1 $\Omega^{-1} \cdot cm^{-1}$.

According to another method of implementation, the diamond thus obtained is doped by boron and hydrogen.

Other aspects, objects and advantages of the invention will become apparent on reading the description of one of its methods of implementation, given by way of nonlimiting example.

Brief Description of the Drawings

The invention will also be more clearly understood with the aid of the drawings, in which:

FIG. 1 shows the donor species diffusion process according to the invention; and FIG. 2 shows the prior step of obtaining an acceptor-doped diamond film.

Detailed Description of the Disclosure

In the various figures, the same references denote identical or similar elements.

FIG. 1 shows one method of implementing the process according to the invention. Described here is a process for obtaining n-type diamond by exposing an acceptor-doped diamond to a hydrogen microwave plasma. Other conventional processes used for generating an atomic source of the hydrogen donor species (RF plasma, DC plasma, hot filament, or the like) could also be employed. Instead of hydrogen, another donor species, for example lithium or sodium, or the like, could be used.

An acceptor-doped diamond 12 is placed in a vacuum chamber 2 on a chamber support 6, for example made of graphite and possibly covered with a silicon wafer, and heated to a certain temperature. This acceptor-doped diamond 12 may be a bulk, natural or synthetic, single-crystal or polycrystalline diamond, or for example a single-crystal or polycrystalline diamond film. The chamber also includes, on its side walls 8 or at its top 9, an injection nozzle 5 via which a gas containing a donor species is injected. The donor species may be hydrogen in the form of one or other of its isotopes, namely normal hydrogen, deuterium or tritium, in which case the gas is for example molecular hydrogen ($H_2$). Energy is supplied, from an energy source 10, to the gas in order to dissociate it, so as to generate a plasma 4 that contains the donor species or radicals of the donor species, around the acceptor-doped diamond 12. The donor species then diffuses into the acceptor-doped diamond 12 and forms, with the acceptor atoms contained in the acceptor-doped diamond 12, complexes between the acceptor and the donor species. Donor groups containing an atom of the donor species are formed in the acceptor-doped diamond 12. During this process, the heating of the diamond, due to the energy source 10, is controlled so that the temperature of the diamond remains at or below the dissociation temperature of the complex between the acceptor and the donor species. This is because the plasma heats the acceptor-doped diamond 12 subjected to the diffusion of the donor species. An external cooling/heating system 11 may optionally be employed, allowing the temperature of the diamond to be controlled so that it does not exceed said dissociation temperature of the complex between the acceptor and the donor species.

If a boron-doped diamond is used as acceptor-doped diamond 12 and hydrogen is used as donor species, this dissociation temperature of the complex is around 550° C. for the complex between boron and hydrogen. During the process, by controlling a temperature close to the dissociation temperature of the complex between boron and hydrogen, the hydrogen easily diffuses into the boron-doped diamond 12. It is thus possible to incorporate, into the boron-doped diamond 12, hydrogen atoms with a concentration at least equal to the concentration of boron atoms. It should be noted that hydrogen diffuses much more easily as the H+ ion into the boron-doped diamond 12, as used in the invention, than into an n-type diamond film, as produced by the processes of the prior art. At 550° C. this diffusion is carried out for 8 hours in a boron-doped diamond film 12 0.5 µm in thickness and doped with $5 \times 10^{19}$ cm$^{-3}$ boron acceptor atoms. This diffusion time given here depends on the experimental conditions and makes it possible here to obtain a concentration of donor species at least equal to the acceptor concentration over the entire thickness of the diamond film. For thicker diamonds, or a higher boron concentration, to obtain a donor species concentration at least equal to the acceptor concentration over the entire thickness of the diamond requires a longer diffusion time. An n-type diamond is then obtained, as the sign of the Hall effect shows, this diamond having a high electrical conductivity at room temperature. If it is desired to n-dope only a fraction of the thickness of the boron-doped diamond, the hydrogen diffusion time is adjusted.

The hydrogen diffusion conditions described here are the conditions employed in the implementation method presented, but other techniques allowing the hydrogen to diffuse into an acceptor-doped diamond, such as boron, exist and could be applied in order to obtain the desired distributions of the hydrogen donor species in the acceptor-doped diamond. In particular, it would be possible to employ, apart from the RF plasma, DC plasma and hot filament techniques already mentioned, other known techniques such as low-energy or high-energy implantation, an electrochemical or chemical reaction, ion milling using molecules containing hydrogen (for example $CF_4+H_2$), high-temperature annealing in molecular hydrogen, the annealing of a material deposited on the acceptor-doped diamond and containing a great deal of hydrogen, such as for example diamond-like carbon, hydrogenated amorphous carbon (a-C:H), hydrogenated amorphous carbon nitrides (a-$C_xN_y$:$H_z$) or silicon-based materials (a-Si:H, a-$Si_xN_y$:H, a-SiCN:H), or the like. The technique used requires, however, the introduction of donor species without creating a high concentration of structural defects in the diamond formed, something that is achieved by the method of implementation presented.

Since the boron concentration may be high in the diamond, thanks to its high solubility, it is possible to obtain a high concentration of hydrogen donor species H in the boron-doped diamond 12. In addition, this donor species easily migrates into a boron-doped p-type diamond 12. These two characteristics make it possible to generate donor groups, including the donor species which are the source of electrons released at a temperature of 300 K by means of a small amount of thermal energy.

However, the diffusion coefficient of hydrogen into a boron-doped diamond decreases when the boron concentration in this diamond increases. If the diamond is highly boron-doped, it is therefore possible to obtain a donor species concentration equal to at least the boron concentration over the entire thickness of the diamond, only after a very long diffusion step. The process makes it possible to obtain an n-doped diamond of high electrical conductivity at room temperature. Of course, the n-doped diamond obtained by the process according to the invention is also very useful (highly conducting) for use at high temperatures, below the dissociation temperature of the complexes between acceptor and donor species, at which temperatures the n-type diamond films of the processes of the prior art are used.

Other steps are sometimes needed for providing an n-type diamond, depending on the use to which it is desired to put this diamond, such as for example an annealing step, a step of oxidizing the surface of the diamond, an acid cleaning step, or the like. During these operations, attention should be paid not to exceed the dissociation temperature of the complexes between acceptor and donor species.

Furthermore, if it is desired to produce an n-doped diamond film, it is possible to carry out, prior to the diffusion of the donor species into the diamond, a diamond film p-doped by an acceptor. FIG. 2 shows the production of a diamond film, doped by an acceptor, such as boron, by a microwave plasma chemical vapor deposition (MPCVD) technique. A similar film could also be obtained by for example a hot-filament growth technique. A substrate 1, which may be a natural or synthetic diamond, for example of the single-crystal Ib type; for example (100), or a polycrystalline diamond, is used. Any other type of synthetic diamond may optionally be used, and it is even possible to use a nondiamond substrate, for example a silicon substrate, with a bias or not, an SiC substrate, or an iridium substrate, for example. This substrate is placed in a vacuum chamber 2, on a chamber support 6, as described above. This chamber may now have, on its side walls 8 or on its top 9, one or more injection nozzles 5. If only a single injection nozzle 5 is used, this may inject several gases simultaneously into the chamber 2, among which is commonly a carbon-containing gas, such as $CH_4$ or $CO_2$, and $H_2$, and optionally $O_2$ or $N_2$. Optionally, it is also possible to use a single nozzle for each gas. The amounts of the species injected is controlled by the flow rates of each of the injected gases. In the method of implementation presented, the carbon-containing gas is methane $CH_4$, and the $CH_4$ content relative to $H_2$ is 4 mol %, and may vary between 0.01 and 10 mol %, without this value being limiting as regards the scope of the invention. The total pressure of the gases in the chamber is for example 10 torr, but it may vary between about 1 and 100 torr. The gases contained in the chamber are then subjected to the energy resulting from a source 10 of microwave energy, which dissociates these gases and generates a plasma 4 in the chamber, and mainly around the substate. The microwave power delivered to the gas is equal to or greater than the power needed to initiate the plasma, and may, for example be around 300 W within the context of a microwave plasma chemical vapor deposition technique, as presented here. The plasma heats the substrate and an external cooling/heating system 11 is used to control the temperature of the substrate, which is within the 700° C. to 1000° C. range, for example 820° C. This plasma mainly contains radicals of the species that are present in the gases and dissociated by the energy source 10. The diamond film 3 is formed on the substrate by deposition of the carbon atoms resulting from the dissociation of the carbon radicals present in the plasma 4. The duration of the plasma ranges from a few minutes to a few hours, depending on the growth rate obtained and the desired thickness.

To obtain an acceptor-doped diamond, an acceptor-containing gas is injected in addition to, and simultaneously with, the above gases. For example, to obtain a boron-doped diamond film, it is common to inject diborane $B_2H_6$ in gaseous form via the single injection nozzle 5, or via a nozzle specific to this gas. Other dopants may be injected within the context of the invention, typically all the elements of column III of the Periodic Table of the Elements, such as gallium (Ga), aluminum (Al) and indium (In). The plasma of atoms surrounding the diamond substrate then contains radicals of the acceptor dopant, which makes it possible to grow the diamond film by simultaneously incorporating carbon atoms and acceptor dopant atoms.

In the case of a boron-doped diamond, it is thus possible to obtain a diamond thickness ranging up to about 100 μm, doped with boron concentrations of around $1\times10^{16}$ to $5\times10^{21}$ cm$^{-3}$, this being generally uniform over the thickness of the diamond film and this concentration depending on the experimental conditions. By controlling the respective concentrations of the carbon and boron atoms in the plasma, it is possible in fact to control the boron concentration in the diamond film.

In the method of implementation presented here, by using the above step, a boron-doped diamond film having a concentration of between about $1\times10^{19}$ cm$^{-3}$ to $5\times10^{19}$ cm$^3$ over a thickness of 0.5 μm is obtained. This acceptor-doped diamond film may optionally be produced by deposition on a synthetic diamond buffer film (not shown), with a thickness of the order of one micron or less, in general undoped or lightly doped with boron, but possibly doped by another species, which is placed between the substrate and the doped film 12 undergoing growth, so as to supply this film undergoing growth with an initial surface containing fewer defects.

Once the boron-doped diamond film has been obtained, the injection of the carbon-containing gas and of the acceptor-containing gas is interrupted, and the system is cooled. The injection of the hydrogen-containing gas may then be cut off and the diamond obtained may be transported to another device, as shown in FIG. 1, in which it may be subjected to the diffusion of the donor species, using one of the techniques listed above. Alternatively, it is possible to use the same chamber to carry out the diffusion of the donor species. In the case in which hydrogen constitutes the donor species, the acceptor-doped diamond film obtained may remain in the chamber 2 of FIG. 2, and the flow of hydrogen-containing gas need not be interrupted, and only the temperature of the substrate is adapted using, for example, the external cooling/heating system 11.

Optionally, it is conceivable to leave the acceptor-doped diamond film 3 in the chamber, to cut off the flow of hydrogen-containing gas and to inject the gas containing the donor species in its stead, if hydrogen is not the donor species.

The invention claimed is:

1. A process for producing an n-type diamond, which includes an n-doping step in which a donor species is vacuum diffused into an initially acceptor-doped diamond, in order to form donor groups containing the donor species in said diamond, at a temperature that does not exceed the dissociation temperature of complexes formed between the acceptor and the donor species.

2. The process as claimed in claim 1, in which the n-doping step comprises making the donor species diffuse for a long enough time for the concentration of donor species in the n-type diamond obtained to be at least equal to the acceptor concentration.

3. The process as claimed in claim 1, in which the n-doping step is carried out in a chamber by forming, around the diamond, a plasma that contains the donor species, which is introduced in gaseous form into the chamber.

4. The process as claimed in claim 1, which furthermore includes, prior to the n-doping step, a p-doping step in which carbon atoms and acceptor atoms are simultaneously deposited, in a vacuum, on a diamond substrate, said atoms being contained in a plasma formed around the diamond substrate in order to form the acceptor-doped diamond.

5. The process as claimed in claim 4, in which the p-doping step is carried out on a diamond buffer film placed on the diamond substrate.

6. The process as claimed in claim 4, in which the p-doping step is carried out in a chamber by forming, around the diamond substrate, a plasma that includes the acceptor and the carbon, these being introduced in gaseous form into the chamber.

7. The process as claimed in claim 6, in which the donor species is hydrogen.

8. The process as claimed in claim 7, in which the acceptor is boron.

9. The process as claimed in claim 7, in which the acceptor is boron and in which the diffusion of the hydrogen donor species is carried out at a temperature of between 500° C. and 600° C., and preferably at around 550° C.

10. An n-type diamond, characterized in that it is doped by hydrogen and boron and in that it possesses a conductivity at 300 K substantially equal to or greater than 1 $\Omega^{-1}.cm^{-1}$.

* * * * *